(12) United States Patent
Asai

(10) Patent No.: US 9,814,137 B2
(45) Date of Patent: Nov. 7, 2017

(54) WIRING BOARD AND METHOD OF MANUFACTURING SAME

(71) Applicant: Murata Manufacturing Co., Ltd., Kyoto (JP)

(72) Inventor: Ryota Asai, Kyoto (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 15/135,638

(22) Filed: Apr. 22, 2016

(65) Prior Publication Data

US 2016/0242286 A1   Aug. 18, 2016

Related U.S. Application Data

(63) Continuation of application No. PCT/JP2014/074616, filed on Sep. 18, 2014.

(30) Foreign Application Priority Data

Oct. 24, 2013   (JP) ................................ 2013-221127

(51) Int. Cl.
*H05K 1/09*   (2006.01)
*H05K 1/11*   (2006.01)
(Continued)

(52) U.S. Cl.
CPC ........... *H05K 1/115* (2013.01); *H05K 1/0298* (2013.01); *H05K 1/0306* (2013.01); *H05K 1/038* (2013.01);
(Continued)

(58) Field of Classification Search
CPC ........... H05K 1/115; B32B 3/00; B32B 17/06; B32B 18/00; H01L 23/48; H01L 23/52
(Continued)

(56) References Cited

U.S. PATENT DOCUMENTS 6,163,313 A * 12/2000 Aroyan ................... G06F 3/045
178/18.04
7,473,460 B2 * 1/2009 Meguro ............... H01L 21/4807
174/258

(Continued)

FOREIGN PATENT DOCUMENTS

| JP | 2004-146818 A | 5/2004 |
| JP | 2009-135184 A | 6/2009 |
| WO | 2007/063692 A1 | 6/2007 |

OTHER PUBLICATIONS

Written Opinion for PCT/JP2014/074616 dated Nov. 9, 2014.
International Search report for PCT/JP2014/074616 dated Dec. 9, 2014.

*Primary Examiner* — Xiaoliang Chen
(74) *Attorney, Agent, or Firm* — Pearne & Gordon LLP

(57) ABSTRACT

A wiring board is provided with: an insulating layer; a base electrode layer layered on one primary surface of the insulating layer in predetermined regions; an insulating covering layer layered on one primary surface of the insulating layer in a state covering parts of edges of the base electrode layer; and a surface electrode layer plated on exposed portions of the base electrode layer not covered by the insulating covering layer, the thickness of covered portions of the base electrode layer covered by the insulating covering layer being less than the thickness of the exposed portions. The surface electrode layer is formed only on the exposed portions of the base electrode layer.

5 Claims, 10 Drawing Sheets

(51) Int. Cl.
*H05K 3/28* (2006.01)
*H05K 3/24* (2006.01)
*H05K 1/02* (2006.01)
*H05K 1/03* (2006.01)
*H05K 3/10* (2006.01)

(52) U.S. Cl.
CPC ............... *H05K 1/09* (2013.01); *H05K 3/108* (2013.01); *H05K 3/244* (2013.01); *H05K 3/28* (2013.01); *H05K 2201/0145* (2013.01); *H05K 2201/0195* (2013.01); *H05K 2201/0338* (2013.01); *H05K 2201/0391* (2013.01); *H05K 2201/099* (2013.01); *H05K 2201/09909* (2013.01)

(58) Field of Classification Search
USPC ...... 174/251, 258; 428/209, 210; 361/301.4, 361/312, 321.4
See application file for complete search history.

(56) References Cited

U.S. PATENT DOCUMENTS

| | | | | |
|---|---|---|---|---|
| 8,558,396 B2* | 10/2013 | Kelkar | .................... | H01L 24/05 |
| | | | | 257/678 |
| 8,730,648 B2* | 5/2014 | Wozniak | ................ | B32B 18/00 |
| | | | | 361/301.4 |
| 8,736,401 B2* | 5/2014 | Kanno | ................... | H01G 4/255 |
| | | | | 333/185 |
| 9,112,262 B2* | 8/2015 | Warnick | ................... | H01Q 5/35 |
| 2007/0224400 A1* | 9/2007 | Meguro | .............. | H01L 21/4807 |
| | | | | 428/209 |

* cited by examiner

WIRING BOARD AND METHOD OF MANUFACTURING SAME

BACKGROUND

Technical Field

The present disclosure relates to a wiring board in which a base electrode layer and a surface electrode layer that forms an outer electrode for connecting to an external element are formed on one primary surface of an insulating layer, and to a method for manufacturing the stated wiring board.

A wiring board provided with an outer electrode for connecting to an external element has existed for some time (see Patent Document 1). As illustrated in FIG. 13, this wiring board 100 includes, for example, a multilayer body 102 formed by layering a plurality of insulating layers 101, a plurality of base electrode layers 103a layered upon a primary surface of the multilayer body 102, an insulating covering layer 106 layered upon the main surface of the multilayer body 102 such that peripheral edge portions of the base electrode layers 103a are covered, and a surface electrode layer 103b formed on exposed surfaces of the base electrodes 103a that are not covered by the insulating covering layer 106; here, outer electrodes 103 for connecting to an external element are formed by the base electrode layers 103a and the surface electrode layer 103b.

Each of the insulating layers 101, which are formed from a polyimide-based resin, has various types of wiring electrodes 104 formed on a primary surface thereof, and furthermore has a via conductor 105 for interlayer connection formed therein; a three-dimensional wiring structure is formed in the wiring board 100 using this configuration.

Meanwhile, the insulating covering layer 106, which is formed from a solder resist, is provided in order to optimize a connected surface area determined by the outer dimensions of the surface electrode layer, prevent shorts between adjacent outer electrodes 103, and so on when soldering the outer electrodes 103 to an external motherboard or component. Note that FIG. 13 is a diagram illustrating an example of such a conventional wiring board.

Patent Document 1: Japanese Unexamined Patent Application Publication No. 2009-135184 (see paragraphs 0019 to 0023, FIG. 7, and so on)

BRIEF SUMMARY

Incidentally, in the above-described wiring board 100, the insulating covering layer 106 layered upon the primary surface of the multilayer body 102 tends to become thinner in parts that cover the peripheral edges of the base electrodes 103a. When the insulating covering layer 106 is thin, there is a risk that the plating that forms the surface electrode layer 103b that is actually connected to the exterior element will be formed not only on the exposed surface of the base electrodes 103a, which is where the surface electrode layer 103b is originally intended to be formed, but also on the parts of the insulating covering layer 106 that cover the edges of the base electrode layers 103a. In this case, there is a problem that the desired outer dimensions cannot be obtained for the surface electrode layer 103b.

Initially making the insulating covering layer 106 thicker across the entire surface can be thought of as a way to ensure the thickness of the insulating covering layer 106 at the parts thereof that cover the peripheral edges of the base electrodes 103a so as to improve the dimensional accuracy of the surface electrode layer 103b. However, doing so makes it difficult to ensure a low profile for the wiring board 100, and is thus not a measure that can be easily employed.

Having been achieved in light of the above-described problems, the present disclosure provides a wiring board that improves the dimensional accuracy of a surface electrode connected to an external element, and a method of manufacturing such a wiring board.

A wiring board according to the present disclosure includes an insulating layer, a base electrode layer layered upon a predetermined region of one primary surface of the insulating layer, an insulating covering layer layered upon the one primary surface of the insulating layer in a state covering at least part of an edge portion of the base electrode layer, and a surface electrode layer plated on an exposed portion of the base electrode layer that is not covered by the insulating covering layer. The covered portion of the base electrode layer covered by the insulating covering layer is formed so as to be thinner than the exposed portion.

In this case, the covered portion of the base electrode layer that is covered by the insulating covering layer is formed so as to be thinner than the exposed portion, and thus the insulating covering layer on the covered portion can be made thicker by an amount equivalent to a difference between the thicknesses of the covered portion and the exposed portion of the base electrode layer, as compared to the thickness of a part of an insulating covering layer that covers an edge portion of a base electrode layer in a conventional wiring board in which the base electrode layer is formed at a uniform thickness. By doing so, the plating that forms the surface electrode layer is suppressed from being formed on the insulating covering layer that covers the covered portion of the base electrode layer, and thus the surface electrode layer is formed on the exposed portion of the base electrode layer with high dimensional accuracy. Accordingly, it is possible to provide a wiring board that achieves an improvement in dimensional accuracy of the surface electrode layer connected to an external element. Furthermore, increasing the dimensional accuracy of the surface electrode layer makes it possible to achieve a narrower pitch in outer electrodes, whose connected surface areas are determined by the outer dimensions of the surface electrode layer. Further still, it is not necessary to make the insulating covering layer thicker to improve the dimensional accuracy of the surface electrode layer.

The covered portion of the base electrode layer may have a pattern that is T-shaped when viewed in plan view (viewed in a direction perpendicular to the one primary surface of the insulating layer), and a leg portion of the T-shaped pattern may be connected to an edge portion of the exposed portion. In this case, the covered portion of the base electrode layer formed having the T-shaped pattern is formed so as to be thinner than the exposed portion, and thus the part of the insulating covering layer that covers the base electrode layer becomes thicker. The same effects as those described above can therefore be achieved. Meanwhile, in the case where the base electrode layer is formed through, for example, screen printing using a conductive paste, forming the T-shaped pattern of thin lines suppresses the conductive paste from escaping from the screen, which makes it possible to form the covered portion of the base electrode layer so as to be thinner than the exposed portion.

Meanwhile, a plurality of the base electrode layers may be provided, and the insulating covering layer may be formed so as to span a gap between adjacent base electrode layers. In this case, the surface electrode layer is formed on each of the exposed portions of adjacent base electrode layers with a high dimensional accuracy surface electrode layer, and thus the surface electrode layers formed on the respective exposed portions of adjacent base electrode layers can be prevented from shorting even in the case where the outer electrodes, whose connected surface areas are determined by the outer dimensions of the surface electrode layer, are disposed at a narrow pitch.

A method of manufacturing a wiring board according to the present disclosure is a method of manufacturing a wiring board including an insulating layer. The method includes a base electrode layer forming step of layering a base electrode layer on a predetermined region of one primary surface of the insulating layer through screen printing using a conductive paste and a mask member, an insulating covering layer forming step of layering an insulating covering layer upon the one primary surface of the insulating layer in a state covering at least part of an edge portion of the base electrode layer, and a surface electrode layer forming step of plating a surface electrode layer on an exposed portion of the base electrode layer that is not covered by the insulating covering layer. Here, in the base electrode layer forming step, the covered portion of the base electrode layer is formed so as to be thinner than the exposed portion by forming a predetermined hole pattern that suppresses the conductive paste from escaping in a location of the mask member that corresponds to the covered portion of the base electrode layer covered by the insulating covering layer.

In this case, in the base electrode layer forming step, the covered portion of the base electrode layer can be formed so as to be thinner than the exposed portion by forming the predetermined hole pattern that suppresses the conductive paste from escaping in a location of the mask member that corresponds to the covered portion of the base electrode layer covered by the insulating covering layer. Furthermore, by forming the covered portion of the base electrode layer so as to be thinner than the exposed portion, when forming the insulating covering layer by applying a paste-form insulating material to the one primary surface of the insulating layer in the insulating covering layer forming step, for example, the insulating paste that forms the insulating covering layer is suppressed from spreading at a border between the exposed portion and the covered portion of the base electrode layer by the difference between the thicknesses thereof. The insulating paste that forms the insulating covering layer accumulates on the covered portion of the base electrode layer as a result, and thus the insulating covering layer on the covered portion of the base electrode layer can be formed thicker than the insulating covering layer of conventional wiring boards in which the base electrode layer is formed at a uniform thickness. Furthermore, making the insulating covering layer on the covered portion of the base electrode layer thicker makes it possible to prevent the surface electrode layer from being formed on the insulating covering layer that covers the covered portion of the base electrode layer in the surface electrode forming step. Accordingly, it is possible to manufacture a wiring board that achieves an improvement in dimensional accuracy of the surface electrode layer connected to an external element.

Meanwhile, by forming the hole pattern that suppresses the conductive paste from escaping in the location of the mask member that corresponds to the cover of the base electrode layer covered by the insulating covering layer, the covered portion of the base electrode layer can be formed so as to be thinner than the exposed portion using a single mask member. This makes it possible to increase the productivity.

Another method of manufacturing a wiring board according to the present disclosure is a method of manufacturing a wiring board including an insulating layer. The method includes a base electrode layer forming step of layering a base electrode layer on a predetermined region of one primary surface of the insulating layer through screen printing using a conductive paste and a mask member, an insulating covering layer forming step of layering an insulating covering layer upon the one primary surface of the insulating layer in a state covering at least part of an edge portion of the base electrode layer, and a surface electrode layer forming step of plating a surface electrode layer on an exposed portion of the base electrode layer that is not covered by the insulating covering layer. In the base electrode layer forming step, the conductive paste is applied to the covered portion of the base electrode layer covered by the insulating covering layer and the exposed portion at a uniform thickness, and the conductive paste is then further applied only to the exposed portion.

In this case, the base electrode layer is printed over two applications of the paste, which makes it possible to form the covered portion of the base electrode layer so as to be thinner than the exposed portion. Accordingly, the covered portion of the base electrode layer can be formed so as to be thinner than the exposed portion with ease, without necessarily forming a complex hole pattern that suppresses the conductive paste from escaping in a location of the mask member that corresponds to the covered portion of the base electrode layer. Furthermore, a step can be formed at the border between the exposed portion and the covered portion of the base electrode layer with certainty, which improves the effect of suppressing the insulating paste that forms the insulating covering layer from passing over the step and spreading to the exposed portion of the base electrode layer.

In addition, the method of manufacturing may further include a pressing step of pressing a multilayer body constituted of the insulating layer, the base electrode layer, and the insulating covering layer after the insulating covering layer forming step. For example, a method of manufacturing a low-temperature co-fired ceramic wiring board typically includes a process of pressing a multilayer body constituted of a plurality of insulating layers from above and below (a pressure bonding process). Providing such a pressing process entails the insulating covering layer that covers the edge portion of the base electrode layer being pressed between the pressing device and the base electrode layer, which makes the insulating covering layer thinner, and it is thus easier to unintentionally form the surface electrode layer on the insulating covering layer that covers that edge portion. However, according to the present disclosure, the covered portion of the base electrode layer is formed so as to be thinner than the exposed portion, and thus the pressure acting on the insulating covering layer on the covered portion of the base electrode during the pressing is reduced. This makes it possible to prevent the insulating covering layer on the covered portion of the base electrode layer from becoming thinner. As such, the surface electrode layer can be prevented from being plated on the insulating covering layer that covers the covered portion of the base electrode layer even in wiring boards that have pressing processes in their manufacturing processes, which in turn makes it possible to improve the dimensional accuracy of the surface electrode layer.

According to the present disclosure, the covered portion of the base electrode layer that is covered by the insulating covering layer is formed so as to be thinner than the exposed portion, and thus the insulating covering layer on the covered portion can be made thicker by an amount equivalent to a difference between the thicknesses of the covered portion and the exposed portion of the base electrode layer, as compared to the thickness of a part of an insulating covering layer that covers an edge portion of a base electrode layer in a conventional wiring board in which the base electrode layer is formed at a uniform thickness. By doing so, the surface electrode layer is prevented from being plated on the insulating covering layer that covers the covered portion of the base electrode layer, and the surface electrode layer is formed on the exposed portion of the base electrode layer with higher dimensional accuracy than in conventional wiring boards. Accordingly, it is possible to provide a wiring board that achieves an improvement in the dimensional accuracy of the surface electrode layer. Furthermore, increasing the dimensional accuracy of the surface electrode layer makes it possible to narrow the pitch of the outer electrodes. Further still, it is not necessary to make the insulating covering layer thicker to improve the dimensional accuracy of the surface electrode layer.

DETAILED DESCRIPTION

First Embodiment

Figure 1:
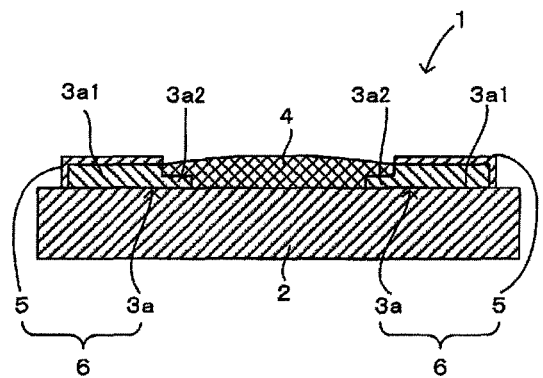
FIG. 1 is a cross-sectional view of a wiring board according to a first embodiment of the present disclosure.
Figure 2:
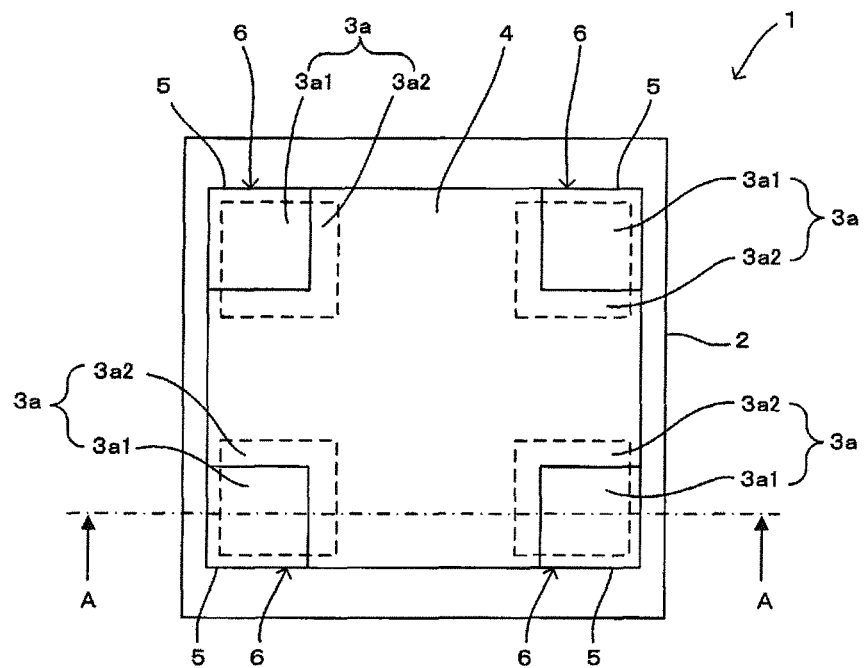
FIG. 2 is a plan view of the wiring board illustrated in FIG. 1.

A wiring board 1 according to a first embodiment of the present disclosure will be described with reference to FIGS. 1 and 2. FIG. 1 is a cross-sectional view of the wiring board 1 according to the first embodiment of the present disclosure, taken along an A-A line indicated in FIG. 2, and FIG. 2 is a plan view of the wiring board 1.

As indicated in FIG. 1, the wiring board 1 according to this embodiment includes an insulating layer 2, a plurality of base electrode layers 3a layered upon predetermined regions of one primary surface of the insulating layer 2, an insulating covering layer 4 layered upon the one primary surface of the insulating layer 2 in a state covering parts of edge portions of each base electrode layer 3a, and a plurality of surface electrode layers 5 formed by plating exposed portions 3a1 of corresponding base electrode layers 3a that are not covered by the insulating covering layer 4; the wiring board 1 is used as any of various types of circuit formation boards.

The insulating layer 2 is formed by layering a plurality of layers formed from a glass epoxy resin, a ceramic material, or the like, for example, and via conductors, various types of wiring electrodes, and so on (not shown) are also formed within the insulating layer 2, on both primary surfaces thereof, and so on. Note that the wiring board 1 may have a single-layer structure.

Each of the base electrode layers 3a is formed from a metal such as Cu or Al so as to have, for example, a quadrangular shape when viewed in plan view, and edge portions thereof are partially covered by the insulating covering layer 4. The base electrode layers 3a are formed so that covered portions 3a2 thereof that are covered by the insulating covering layer 4 are thinner than the exposed portions 3a1 not covered by the insulating covering layer 4, and as a result, steps are formed at the borders between the exposed portions 3a1 and their corresponding covered portions 3a2. The planar shapes of the base electrode layers 3a are not limited to quadrangles, and any other planar shapes may be employed, such as polygons, circles, or the like.

The surface electrode layers 5 are formed by plating corresponding exposed portions 3a1 of the base electrode layers 3a with Ni, and then plating that Ni plate with Au. An outer electrode 6 is formed by the base electrode layer 3a and the surface electrode layer 5 formed on the exposed portion 3a1 of that base electrode layer 3a. The outer electrodes 6 according to this embodiment are used as connecting electrodes for connecting the wiring board 1 to an external motherboard or the like; the wiring board 1 is disposed so that the one primary surface of the insulating layer 2 faces a mounting surface of the motherboard, and mounting electrodes of the motherboard are connected to the outer electrodes 6 of the wiring board 1 through soldering or the like.

The insulating covering layer 4 is formed from a ceramic material, a solder resist, or the like (a ceramic material in this embodiment), and is layered upon the one primary surface of the insulating layer 2 in a state covering parts (the covered portions 3a2) of the edge portions of the base electrode layers 3a. Specifically, as illustrated in FIGS. 1 and 2, the insulating covering layer 4 is formed spanning a gap between adjacent base electrode layers 3a and covers parts of the edge portion (peripheral edge portion) of each base electrode layer 3a that are opposite from other base electrode layers 3a adjacent thereto. In other words, the insulating covering layer 4 according to this embodiment is disposed so that when viewed in plan view, two bands thereof intersect so as to combine and form a plus sign shape, as illustrated in FIG. 2. The insulating covering layer 4 ensures a desired gap between surface electrode layers 5 of the adjacent outer electrodes 6, and the insulating covering layer 4 is provided to prevent adjacent outer electrodes 6 from shorting, to optimize a connected surface area between, for example, the motherboard and the outer electrodes 6, and so on.

Meanwhile, the covered portions 3a2 of the base electrode layers 3a are formed so as to be thinner than the exposed portions 3a1, and thus the insulating covering layer 4 is formed thicker on the covered portions 3a2 of the base electrode layers 3a than in a conventional wiring board in which the base electrode layers are formed at a uniform thickness. The insulating covering layer 4 on the covered portions 3a2 can be no less than 1 μm thick, and can be no less than 5 μm thick, in order to prevent the surface electrode layers 5 from being formed upon the insulating covering layer 4 located on the covered portions 3a2.

(Method of Manufacturing Wiring Board 1)

Next, a method of manufacturing the wiring board 1 according to this embodiment will be described with reference to FIGS. 3 and 4. FIGS. 3A-3D are diagrams illustrating the method of manufacturing the wiring board 1, and FIGS. 4A and 4B are plan views of mask members 7a and 7b used for forming the base electrode layers 3a. FIGS. 3A to 3D indicate individual steps in the manufacturing method, whereas FIGS. 4A and 4B are plan views of the mask members 7a and 7b used when forming the base electrode layers 3a with two applications of the paste.

First, the insulating layer 2, which is formed by layering a plurality of ceramic green sheets formed from a ceramic material, is prepared. At this time, wiring electrodes, via conductors, and the like are formed in advance in the interior, on the surface, and so on of each ceramic green sheet.

Figure 3A:
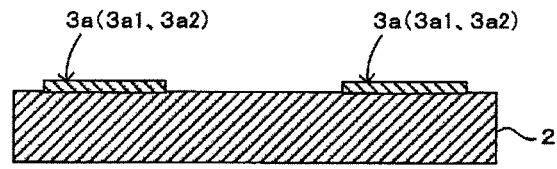
FIGS. 3A-3D are diagrams illustrating a method of manufacturing the wiring board illustrated in FIG. 1.
Figure 4A:
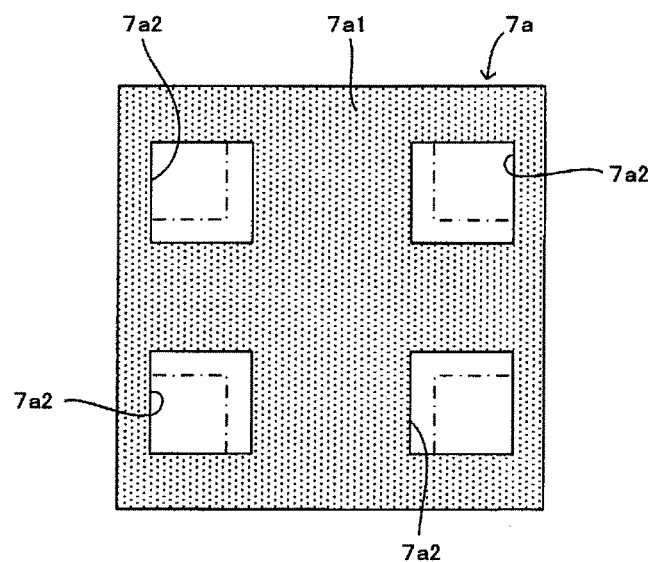
FIGS. 4A and 4B are plan views of mask members.
Figure 4B:
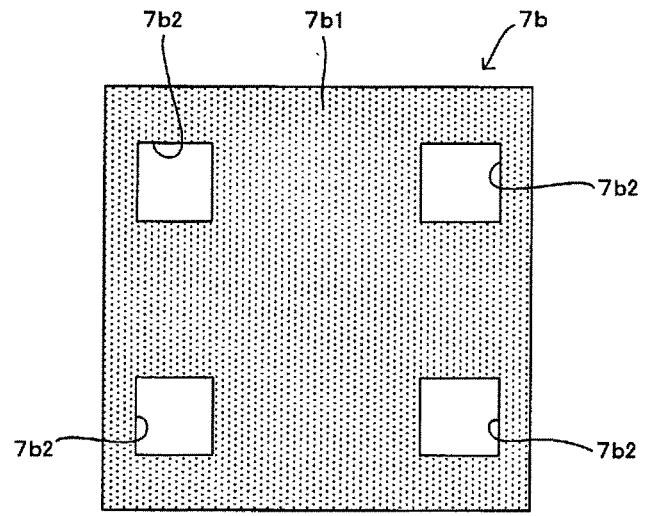

Next, as illustrated in FIG. 3A, a lower level portion of each base electrode 3a is formed through screen printing using a conductive paste containing Cu, for example, and the mask member 7a, in regions of one primary surface of the insulating layer 2 where the base electrode layers 3a are to be formed (predetermined regions). A screen plate, in which a screen woven from fibers such as polyester is stretched upon and fixed to a frame and areas aside from those that are to be printed on are covered by a plate film formed on the screen from a resist or the like, can be used as the mask member 7a used in the screen printing, for example. Specifically, as illustrated in FIG. 4A, the positions of openings 7a2 formed in a plate film 7a1 are set in the mask member 7a so that the conductive paste is applied in both regions of the exposed portions 3a1 of the base electrode layers 3a and the covered portions 3a2 to be covered by the insulating covering layer 4. As a result, the conductive paste is applied at an even thickness to the locations corresponding to the covered portions 3a1 and the exposed portions 3a2 of the base electrode layers 3a. The dot-dash lines in FIG. 4A indicate locations corresponding to the borders between the exposed portions 3a1 and the covered portions 3a2 of the base electrode layers 3a, and the dotted area indicates portions where the plate film 7a1 of the mask member 7a is formed.

Figure 3B:
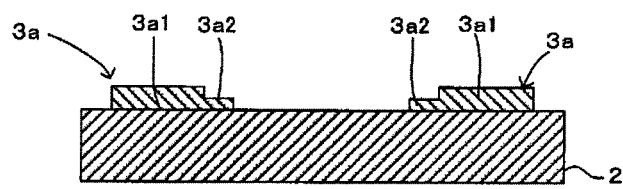

Next, as illustrated in FIG. 3B, the same conductive paste as that applied in the first application is further applied (layered) in only the regions corresponding to the exposed portions 3a1 of the base electrode layers 3a, through the same screen printing using the mask member 7b, thus completing the base electrode layers 3a. The mask member 7b used at this time has the positions of openings 7b2 in a plate film 7b1 set so that the conductive paste is applied only in the exposed portions 3a1 of the base insulating layer 3a, as illustrated in FIG. 4B. Forming the base electrode layers 3a through two paste applications in this manner forms the covered portions 3a2 thinner than the exposed portions 3a1, and furthermore forms steps at the borders between the portions 3a1 and 3a2. In this embodiment, the above-described process of forming the base electrode layers 3a through two instances of screen printing corresponds to a base electrode layer forming step according to the present disclosure. Note that the conductive paste used in the first application and the conductive paste used in the second application may be formed from different materials.

Figure 3C:
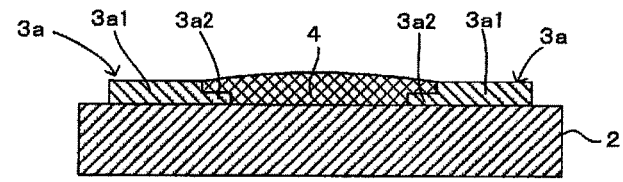

Next, the insulating covering layer 4 is layered upon the one primary surface of the insulating layer 2 in a state covering parts of the edge portions of the base electrode layers 3a (the covered portions 3a2), as illustrated in FIG. 3C (an insulating covering layer forming step). At this time, the insulating covering layer 4 is layered upon the one primary surface of the insulating layer 2 by using a printing technique to apply an insulating paste containing a ceramic material so that the covered portions 3a2 of the base electrode layers 3a and regions of the one primary surface of the insulating layer 2 located between adjacent base electrode layers 3a (see FIGS. 1 and 2) are covered.

Because the covered portions 3a2 of the base electrode layers 3a are formed thinner than the exposed portions 3a1 and steps are formed at the borders between the exposed portions 3a1 and the covered portions 3a2, the insulating paste that forms the insulating covering layer 4 is prevented from spreading by the steps. Accordingly, the insulating paste accumulates upon the covered portions 3a2 of the base electrode layers 3a, and thus the insulating covering layer 4 that covers the covered portions 3a2 of the base electrode layers 3a can be formed thicker than in conventional wiring boards in which the base electrode layers 3a are provided at a uniform thickness. Note that there are cases where the insulating paste of the insulating covering layer 4 flows in toward the exposed portions 3a1 of the base electrode layers 3a, but in such cases, the amount of paste that flows in is suppressed by the steps at the borders between the portions 3a1 and 3a2 of the base electrode layers 3a. Accordingly, changes in the surface area of the exposed portions 3a1 of the base electrode layers 3a caused by variation in the viscosity of the insulating paste that forms the insulating covering layer 4 and the like can be suppressed. Note also that the above-described base electrode layers 3a and insulating covering layer 4 may be formed in advance on the ceramic green sheet that will serve as the uppermost layer of the insulating layer 2 before the ceramic green sheets are layered upon each other.

Next, the insulating layer 2 on whose one primary surface the base electrode layers 3a and the insulating covering layer 4 are formed is fired at a predetermined temperature (850° C., for example).

Figure 3D:
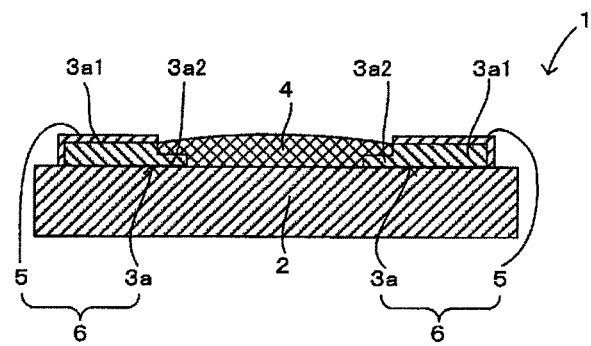

Next, as illustrated in FIG. 3D, the exposed portions 3a1 of the base electrode layers 3a are plated with Ni and then the Ni-plated areas are plated with Au, forming the surface electrode layers 5 constituted by Ni/Au plating on the exposed portions 3a1 of the base electrode layers 3a and completing the wiring board 1 (a surface electrode layer forming step). At this time, the portions of the insulating covering layer 4 that cover the covered portions 3a2 of the base electrode layers 3a are formed so as to be thicker than in conventional techniques, and thus the surface electrodes 5 are prevented from being formed on the insulating covering layer 4 that covers the covered portions 3a2. As a result, the surface electrode layers 5 are formed on the exposed portions 3a1 of the base electrode layers 3a with higher dimensional accuracy than in conventional wiring boards.

As such, according to the above-described embodiment, the covered portions 3a2 of the base electrode layers 3a that are covered by the insulating covering layer 4 are formed so as to be thinner than the exposed portions 3a1, and thus the insulating covering layer 4 on the covered portions 3a2 becomes thicker, by an amount equivalent to the difference between the thicknesses of the covered portions 3a2 and the exposed portions 3a1 of the base electrode layers 3a, than in conventional wiring boards in which the edge portions of a base electrode layer having a uniform thickness are covered by an insulating covering layer. Doing so prevents the surface electrode layers 5 from being formed on the insulating covering layer 4 that covers the covered portions 3a2 of the base electrode layers 3a as well, and the surface electrode layers 5 are formed on the exposed portions 3a1 of the base electrode layers 3a with higher dimensional accuracy than in conventional wiring boards. Accordingly, the wiring board 1 that improves the dimensional accuracy of the outer electrodes 6 constituted by the base electrode layers 3a and the surface electrode layers 5 can be provided. Furthermore, increasing the dimensional accuracy of the surface electrode layers 5 makes it possible to narrow the pitch of the base electrode layers 3a (the outer electrodes 6). Further still, it is not necessary to make the insulating covering layer 4 thicker to improve the dimensional accuracy of the surface electrode layers 5.

In addition, the insulating covering layer 4 is formed spanning a gap between adjacent base insulating layers 3a, and the covered portions 3a2 of the base electrode layers 3a that are covered by the insulating covering layer 4 are formed so as to be thinner than the exposed portions 3a1. As such, the surface electrode layers 5 are formed with high dimensional accuracy on the respective exposed portions 3a2 of adjacent base electrode layers 3a. Accordingly, the surface electrode layers 5 formed on the respective exposed portions 3a1 of adjacent base electrode layers 3a can be prevented from shorting even in the case where the base electrode layers 3a are disposed at a narrow pitch.

In addition, the covered portions 3a2 of the base electrode layers 3a are formed so as to be thinner than the exposed portions 3a1 in the method of manufacturing the wiring board 1. Accordingly, when applying the insulating paste of the insulating covering layer 4 to the one primary surface of the insulating layer 2 in the insulating covering layer forming step, the difference between the thicknesses of the exposed portions 3a1 and the covered portions 3a2 of the base electrode layers 3a suppresses the insulating paste from spreading at the borders between the portions 3a1 and 3a2, and the insulating paste accumulates at the covered portions 3a2 of the base electrode layers 3a. The insulating covering layer 4 on the covered portions 3a2 of the base electrode layers 3a can therefore be made thicker than in conventional wiring boards in which the base electrode layers are formed at a uniform thickness. Furthermore, increasing the thickness of the insulating covering layer 4 on the covered portions 3a2 of the base electrode layers 3a makes it possible to suppress the surface electrode layers 5 from being formed on the insulating covering layer 4 that covers the covered portions 3a2 of the base electrode layers 3a, which in turn makes it possible to manufacture the wiring board 1 capable of improving the dimensional accuracy of the surface electrode layers 5.

In addition, printing the base electrode layers 3a in two instances of screen printing makes it possible to form the covered portions 3a2 thinner than the exposed portions 3a1 with ease. In addition, steps are formed between the exposed portions 3a1 and the covered portions 3a2 of the base electrode layers 3a, which increases the effect of suppressing the spread of the insulating paste that forms the insulating covering layer 4 at the borders between the portions 3a1 and 3a2 of the base electrode layers 3a.

Second Embodiment

Figure 5:
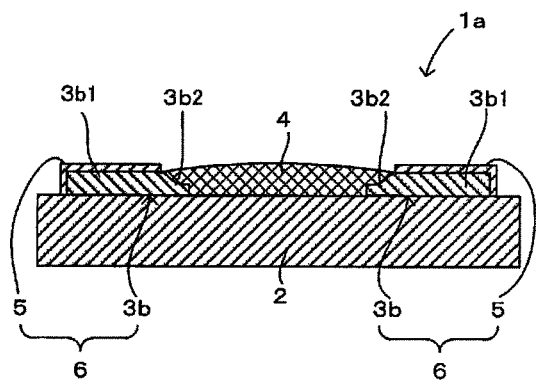
FIG. 5 is a cross-sectional view of a wiring board according to a second embodiment of the present disclosure.

A wiring board 1a according to a second embodiment of the present disclosure will be described with reference to FIGS. 5 and 6. FIG. 5 is a cross-sectional view of the wiring board 1a according to the second embodiment of the present disclosure, taken along a B-B line indicated in FIG. 6, and FIG. 6 is a plan view of the wiring board 1a.

Figure 6:
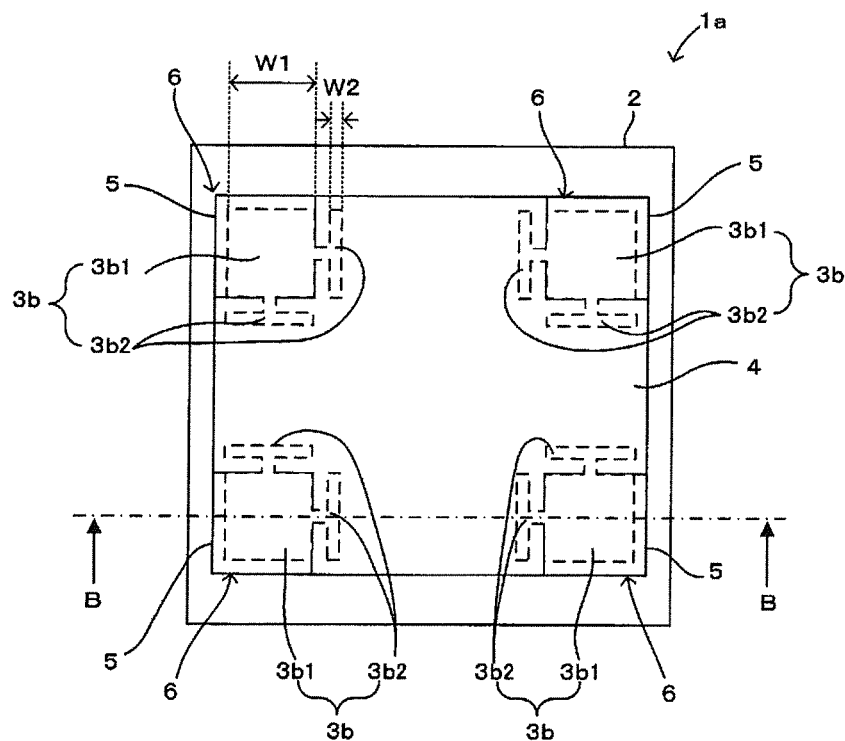
FIG. 6 is a plan view of the wiring board illustrated in FIG. 5.

The wiring board 1a according to this embodiment differs from the wiring board 1 according to the first embodiment described with reference to FIGS. 1 and 2 in that covered portions 3b2 of base electrode layers 3b that are covered by the insulating covering layer 4 are formed having a predetermined patterned shape, as illustrated in FIGS. 5 and 6. The rest of the configuration is the same as that of the wiring board 1 according to the first embodiment, and descriptions thereof will be omitted by using the same reference numerals.

The base electrode layers 3b will be described using a base electrode 3b, of the base electrodes 3b illustrated in FIG. 6, located on the upper-left in the drawing, as an example. An exposed portion 3b1 of the base electrode 3b is formed in a quadrangular shape when viewed in plan view. The covered portion 3b2 includes a pattern, having a substantially T-shape when viewed in plan view, formed so as to extend toward the right in the drawing from a right side, of the sides of the quadrangular exposed portion 3a1, that is located on an inner side of the one primary surface of the insulating layer 2, and a pattern, having a substantially T-shape when viewed in plan view, formed so as to extend downward in the drawing from a lower side of the exposed portion 3b1 that is located on an inner side of the one primary surface of the insulating layer 2. The other base electrode layers 3b include covered portions 3b2 formed having a corresponding patterned shape. Connecting the T-shaped patterns of the covered portions 3b2 to the exposed portions 3b1 in this manner ensures that when, for example, the base electrode layers 3b are connected to via conductors formed within the insulating layer 2, the via conductors are conductive with the surface electrode layers 5 by being connected to the covered portions 3b2. Accordingly, a similar permissible range of positional skew as for the base electrode layers 3a according to the first embodiment can be ensured for the via conductors. When forming the base electrode layers 3b as will be described later, in order to make the covered portions 3b2 thinner than the exposed portions 3b1, a line width W2 of the T-shaped patterns of the covered portions 3b2 of the base electrode layers 3b can be narrow. Specifically, the line width W2 can be less than ½ a minimum width W1 of the exposed portions 3b1.

(Method of Manufacturing Wiring Board 1a)

Next, a method of manufacturing the wiring board 1a according to this embodiment will be described with reference to FIGS. 7 and 8. FIGS. 7A-7C are diagrams illustrating the method of manufacturing the wiring board 1a, and FIG. 8 is a plan view of a mask member 7c used for forming the base electrode layers 3b. FIGS. 7A-7C indicate individual steps in the manufacturing method.

Figure 7A:
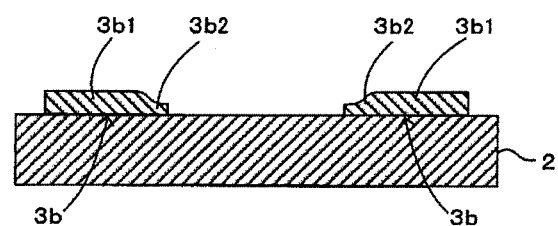
FIGS. 7A-7C are diagrams illustrating a method of manufacturing the wiring board illustrated in FIG. 5.
Figure 8:
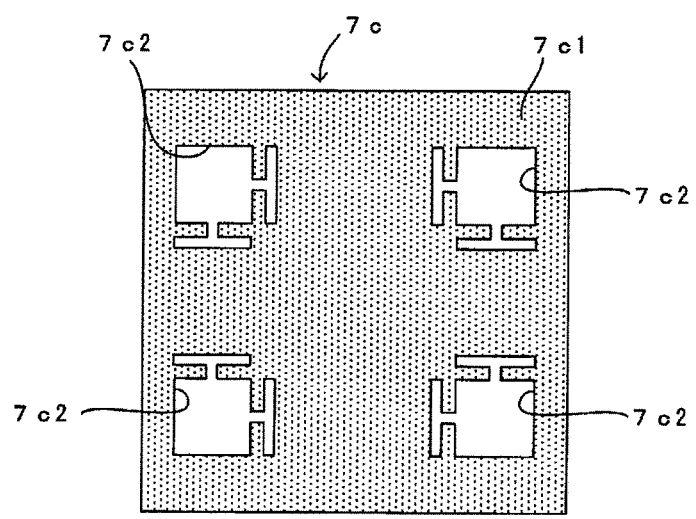
FIG. 8 is a plan view of a mask member.

First, the insulating layer 2 is prepared according to the same procedure as in the method of manufacturing the wiring board 1 according to the first embodiment (a preparation step), after which the base electrode layers 3b are layered upon regions (predetermined regions) of the one primary surface of the insulating layer 2 where the base electrode layers 3b are to be formed, through screen printing using a conductive paste containing Cu and the mask member 7c (a base electrode layer forming step), as illustrated in FIG. 7A. As this time, openings 7c2 having shapes matching the shapes of the base electrode layers 3b when viewed in plan view are formed in predetermined positions of a plate film 7c1 of the mask member 7c, as illustrated in FIG. 8. Specifically, in each of the base electrode layers 3b, a location corresponding to the exposed portion 3b1 is formed in a quadrangular shape, and in locations corresponding to the covered portions 3*b*2, two T-shaped patterns are formed on adjacent inner sides of the quadrangular exposed portion 3*b*1. The openings 7*c*2 having shapes in which the stated quadrangular shapes and T shapes are combined are formed as a result (this corresponds to a "hole pattern" according to the present disclosure). At this time, each of the openings 7*c*2 can be set so that an opening width at the locations corresponding to the covered portions 3*b*2 (corresponding to the width W2 in FIG. 6) is less than ½ a minimum opening width at the location corresponding to the exposed portion 3*b*1 (corresponding to the width W1 in FIG. 6).

Reducing the opening width of the parts of the plate film 7*c*1 of the mask member 7*c* that form the covered portions 3*b*2 suppresses the conductive paste from escaping from those portions, and thus the covered portions 3*b*2 of the base electrode layers 3*b* can be formed thinner than the exposed portions 3*b*1. At this time, the covered portions 3*b*2 become gradually thinner as the covered portions 3*b*2 progress away from the corresponding exposed portions 3*b*1, as illustrated in FIG. 5. Note that in the above-described base electrode layers 3*b*, it is sufficient that the covered portions 3*b*2 be formed thinner than the exposed portions 3*b*1, and thus there is no problem if the pattern of the covered portions 3*b*2 seeps and spreads out at the time of printing, for example.

Figure 7B:
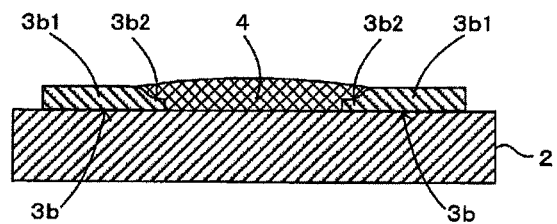

Next, as illustrated in FIG. 7B, the insulating covering layer 4 is layered on the one primary surface of the insulating layer 2 in a state covering parts of the edge portions of the base electrode layers 3*b* (the covered portions 3*b*2), using the same procedure as in the method of manufacturing the wiring board 1 according to the first embodiment (an insulating covering layer forming step). At this time, the covered portions 3*b*2 of the base electrode layers 3*b* are formed thinner than the exposed portions 3*b*1, in the same manner as in the first embodiment. As such, the insulating paste that forms the insulating covering layer 4 is suppressed from spreading by the difference between the thicknesses of the portions 3*b*1 and 3*b*2 of the base electrode layers 3*b*, and accumulates on the covered portions 3*b*2 of the base electrode layers 3*b*. Accordingly, the insulating covering layer 4 that covers the covered portions 3*b*2 of the base electrode layers 3*b* can be formed thicker than in conventional wiring boards in which the base electrode layers are provided at a uniform thickness. Note that the base electrode layers 3*b* and the insulating covering layer 4 may be formed in advance on the ceramic green sheet that will serve as the uppermost layer of the insulating layer 2 before the ceramic green sheets are layered upon each other, as in the method of manufacturing the wiring board 1 according to the first embodiment.

Next, the insulating layer 2 on whose one primary surface the base electrode layers 3*b* and the insulating covering layer 4 are formed is fired at a predetermined temperature (850° C., for example).

Figure 7C:
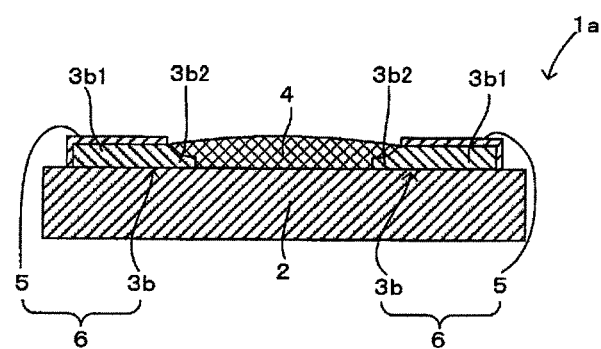

Next, as illustrated in FIG. 7C, the surface electrode layers 5 constituted by Ni/Au plating is formed on the exposed portions 3*b*1 of the base electrode layers 3*b* and the wiring board 1*a* is completed through the same procedure as in the method of manufacturing the wiring board 1 according to the first embodiment (a surface electrode layer forming step). At this time, the parts of the insulating covering layer 4 that cover the covered portions 3*b*2 of the base electrode layers 3*b* are formed so as to be thicker than in the past, and the surface electrode layers 5 are therefore prevented from being formed on the insulating covering layer 4 that covers the covered portions 3*b*2. As a result, the surface electrode layers 5 are formed with high dimensional accuracy on the exposed portions 3*b*1 of the base electrode layers 3*b*, or in other words, the outer electrodes 6 constituted by the base electrode layers 3*b* and the surface electrode layers 5 are formed with high dimensional accuracy.

As such, according to the above-described embodiment, the covered portions 3*b*2 of the base electrode layers 3*b* covered by the insulating covering layer 4 are formed so as to be thinner than the exposed portions 3*b*1, and thus the insulating covering layer 4 on the covered portions 3*b*2 can be made thicker by an amount equivalent to a difference between the thicknesses of the covered portions 3*b*2 and the exposed portions 3*b*1 of the base electrode layers 3*b*. By doing so, the surface electrode layers 5 are prevented from being plated on the insulating covering layer 4 that covers the covered portions 3*b*2 of the base electrode layers 3*b*, and the surface electrode layers 5 are formed on the exposed portions 3*b*1 of the base electrode layers 3*b* with higher dimensional accuracy than conventional wiring boards. The same effects as those of the wiring board 1 according to the first embodiment can be achieved as a result.

Meanwhile, the covered portions 3*b*2 of the base electrode layers 3*b* are formed so as to be thinner than the exposed portions 3*b*1 in the method of manufacturing the wiring board 1*a*. Accordingly, when applying the insulating paste of the insulating covering layer 4 to the one primary surface of the insulating layer 2 in the insulating covering layer forming step, the difference between the thicknesses of the exposed portions 3*b*1 and the covered portions 3*b*2 of the base electrode layers 3*b* suppresses the insulating paste from spreading at the borders between the portions 3*b*1 and 3*b*2, and the insulating paste accumulates at the covered portions 3*b*2 of the base electrode layers 3*b*. The insulating covering layer 4 on the covered portions 3*b*2 of the base electrode layers 3*b* can therefore be made thicker than in conventional wiring boards in which the base electrode layers are formed at a uniform thickness.

Furthermore, forming the insulating covering layer 4 thicker on the covered portions 3*b*2 of the base electrode layers 3*b* makes it possible to prevent the surface electrode layers 5 from being formed on the insulating covering layer 4 that covers the covered portions 3*b*2 of the base electrode layers 3*b*, and thus the wiring board 1*a* that improves the dimensional accuracy of the outer electrodes 6 constituted by the base electrode layers 3*b* and the surface electrode layers 5 can be manufactured. Further still, in this embodiment, the locations of the mask member 7*c* that correspond to the covered portions 3*b*2 of the base electrode layers 3*b* are formed having a T-shaped hole pattern that suppresses the conductive paste from escaping. This makes it possible to form the covered portions 3*b*2 of the base electrode layers 3*b* thinner than the exposed portions 3*b*1 using the single mask member 7*c*, which provides higher productivity.

(Variations on Base Electrode Layers 3*b*)

Figure 9A:
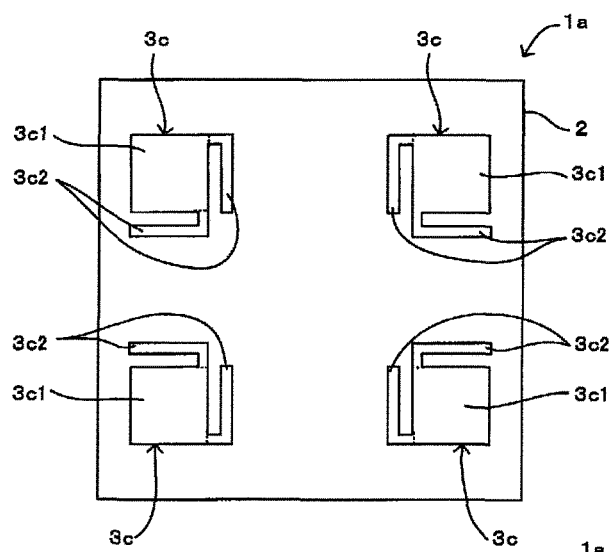
FIGS. 9A-9C are diagrams illustrating variations on a base electrode layer.
Figure 9B:
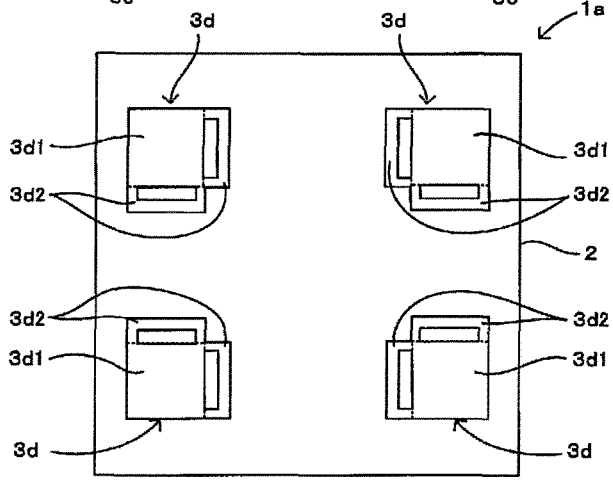
Figure 9C:
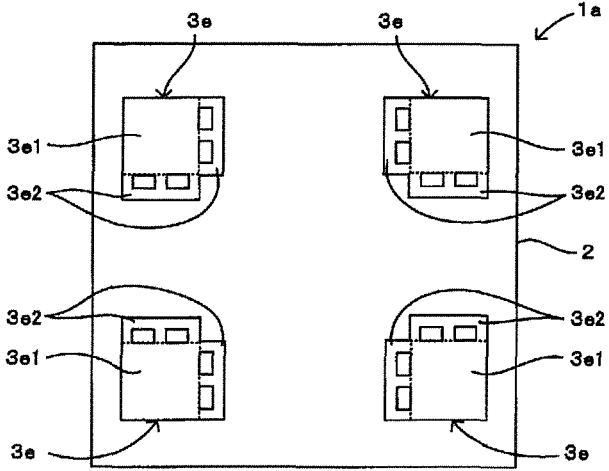

Next, variations on the base electrode layers 3*b* will be described with reference to FIGS. 9A-9C. FIGS. 9A-9C are plan views of the wiring board 1*a* illustrating variations on the base electrode layers 3*b*. To simplify the descriptions, FIGS. 9A-9C illustrate only the insulating layer 2 and base electrode layers 3*c* to 3*e* of the wiring board 1*a*, and do not illustrate the rest of the elements.

With the base electrode layers 3*b* according to the above-described second embodiment, the covered portions 3*b*2 of the base electrode layers 3*b* were described as having two substantially T-shaped patterns (see FIG. 6 and so on) as predetermined patterned shapes. However, when forming the base electrode layers 3*b*, the holes at the locations of the mask member 7c that correspond to the covered portions 3b2 of the base electrode layers 3b are formed in thin line shapes to suppress the conductive paste from escaping, and the covered portions 3b2 of the base electrode layers 3b may be formed having any desired patterned shape as long as the covered portions 3b2 are formed of combinations of thin line patterns.

For example, as illustrated in FIG. 9A, in each of base electrode layers 3c, an exposed portion 3c1 may be formed having a quadrangular shape when viewed in plan view, and covered portions 3c2 disposed on each of two sides of a corresponding exposed portion 3c1 on an inner side of the quadrangular shape thereof may be formed having the following patterned shape. Taking the base electrode layer 3c disposed on the upper-left in the drawing as an example, the covered portions 3c2 have two substantially L-shaped patterns when viewed in plan view; one of the L-shaped patterns is disposed in a rotated manner such that a leading end of the short part of the L shape is connected to an upper end of the right side of the exposed portion 3c1, whereas the other L-shaped pattern is disposed in a rotated manner such that a leading end of the short part of the L shape is connected to an right end of the lower side of the exposed portion 3c1. The base electrode layer 3c is formed having a shape in which the quadrangular exposed portion 3c1 is combined with the two covered portions 3c2 that have substantially L-shaped patterns. Note that as illustrated in FIG. 9A, the other base electrode layers 3c in FIG. 9A also include covered portions 3c2 formed so as to be connected to two inner sides of a corresponding quadrangular exposed portion 3c1 in the same manner, by rotating and moving the two substantially L-shaped patterns in a linearly symmetrical manner taking the lengthwise direction of the long part of the L shape as an axis of symmetry.

Meanwhile, base electrode layers 3d may be formed having the planar shape illustrated in FIG. 9B as well. Specifically, to take the base electrode layer 3d disposed on the upper-left in the drawing as an example, an exposed portion 3d1 of the base electrode layer 3d is formed having a quadrangular shape when viewed in plan view, and covered portions 3d2 are disposed on two of the inner sides of that quadrangle (a right side and a lower side). In other words, the covered portion 3d2 includes a right-side adjacent pattern having a patterned shape formed by two extended portions formed so as to extend from upper and lower end portions of the right side of the quadrangular exposed portion 3d1 toward the right, perpendicular to the stated right side, and a strip-shaped main body portion that is disposed parallel to the right side of the exposed portion 3d1 and connects both end portions of the extended portions to each other. Furthermore, the covered portion 3d2 includes a lower-side adjacent pattern having a patterned shape formed by two extended portions formed so as to extend from left and right end portions of the lower side of the quadrangular exposed portion 3d1 downward, perpendicular to the stated lower side, and a strip-shaped main body portion that is disposed parallel to the lower side of the exposed portion 3d1 and connects both end portions of the extended portions to each other. Note that as illustrated in FIG. 9B, the other base electrode layers 3d in FIG. 9B also have the same patterned shape, with the covered portions 3d2 disposed and connected to the two inner sides of the quadrangular exposed portion 3d1.

Furthermore, as illustrated in FIG. 9C, in each of base electrode layers 3e, an exposed portion 3e1 may be formed having a quadrangular shape when viewed in plan view, and covered portions 3e2 disposed on each of two sides of a corresponding exposed portion 3e on an inner side of the quadrangular shape thereof may be formed having the following patterned shape. Taking the base electrode layer 3e disposed on the upper-left in the drawing as an example, the covered portions 3e2 have two substantially E-shaped patterns when viewed in plan view. One of the substantially E-shaped patterns is disposed so that the end portions of each short part thereof are connected to the right side of the quadrangular exposed portion 3e1, with the pattern being moved with linear symmetry taking the lengthwise direction of the long part of the pattern as an axis of symmetry; and the other substantially E-shaped pattern is rotated and moved so that the end portions of the short parts thereof are connected to the lower side of the quadrangular exposed portion 3e1. The base electrode layer 3e is formed having a shape in which the quadrangular exposed portion 3e1 is combined with three covered portions 3c2 that have substantially E-shaped patterns. Note that as illustrated in FIG. 9C, the other base electrode layers 3e in FIG. 9C also include covered portions 3c2 formed so as to be connected and disposed to two inner sides of a corresponding quadrangular exposed portion 3e1 in the same manner, by rotating and moving the two substantially E-shaped patterns in a linearly symmetrical manner taking the lengthwise direction of the long part of the E shape as an axis of symmetry.

Like the base electrode layers 3b of the wiring board 1a according to the second embodiment, in the above-described variations, a line width of the patterns of the covered portions 3c2 to 3e2 can be formed so as to be less than ½ a minimum width of the exposed portions 3c1 to 3e1 (see the minimum width W1 of the exposed portions 3b1 and the line width W2 of the covered portions 3b2 in FIG. 6). Doing so suppresses the conductive paste of the covered portions 3c2 to 3e2 from escaping when the screen printing the base electrode layers 3c to 3e, which makes it possible to form the covered portions 3c2 to 3e2 so as to be thinner than the exposed 3c1 to 3e1, in the same manner as in the second embodiment.

Third Embodiment

Figure 10:
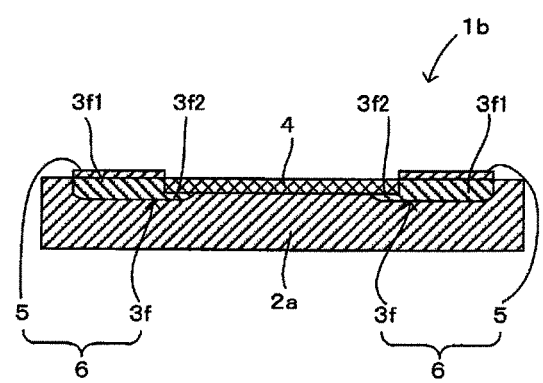
FIG. 10 is a cross-sectional view of a wiring board according to a third embodiment of the present disclosure.

A wiring board 1b according to a third embodiment of the present disclosure will be described with reference to FIG. 10. FIG. 10 is a cross-sectional view of the wiring board 1b.

The wiring board 1b according to this embodiment differs from the wiring board 1 according to the first embodiment described with reference to FIGS. 1 and 2 in that in a method of manufacturing the wiring board 1b, a multilayer body constituted of an insulating layer 2a, base electrode layers 3f, and the insulating covering layer 4 is pressure-bonded before forming the surface electrode layers 5, and the wiring board 1b is formed in such a manner (see FIG. 10). The rest of the configuration is the same as that of the wiring board 1 according to the first embodiment, and descriptions thereof will be omitted by using the same reference numerals.

In this case, the insulating layer 2a is constituted of a plurality of ceramic green sheets formed from low-temperature co-fired ceramics (LTCC), for example, and various types of wiring electrodes, via conductors, and so on (not shown) are formed on the surfaces, interiors, and so on of each ceramic green sheet. Furthermore, as illustrated in FIG. 10, covered portions 3f2 of the base electrode layers 3f are formed so as to be thinner than exposed portions 3f1, in the same manner as in the wiring board 1 according to the first embodiment. The base electrode layers 3f and the insulating covering layer 4 are layered upon one primary surface of the insulating layer 2a, after which the multilayer body is pressure-bonded; this presses the base electrode layers 3f and the insulating covering layer 4 into the insulating layer 2a so that one primary surface of the wiring board 1b, upper surfaces of the exposed portions 3f1 of the base electrode layers 3f, and an upper surface of the insulating covering layer 4 are substantially disposed in the same plane.

Incidentally, in a typical method of manufacturing an LTCC multilayer substrate, the ceramic green sheets are layered in a predetermined order and the resulting multilayer body is then pressure-bonded. Here, in a conventional wiring board in which the base electrode layer is formed at a uniform thickness, a strong pressure acts on the insulating covering layer on the covered portions of the base electrode layer during the pressure bonding, it is easy for the insulating covering layer on the covered portions of the base electrode layer to become thinner. Accordingly, there is a higher risk that the plating of the surface electrode layer will be formed on the insulating covering layer on the covered portions of the base electrode layer as well.

However, in the wiring board 1b according to this embodiment, the covered portions 3f2 of the base electrode layers 3f are formed so as to be thinner than the exposed portions 3f1. As such, compared to conventional wiring boards, not only can the thickness of the insulating covering layer 4 on the covered portions 3f2 be ensured, but the pressure acting on the insulating covering layer 4 on the covered portions 3f2 during the pressure bonding is reduced by the difference between the thicknesses of the exposed portions 3f1 and the covered portions 3f2 of the base electrode layers 3f. Accordingly, the insulating covering layer 4 on the covered portions 3f2 will not become thinner even when the multilayer body is pressure-bonded, and the surface electrode layers 5 are prevented from being formed on the insulating covering layer 4 that covers the covered portions 3f2 of the base electrode layers 3f; the surface electrode layers 5 are formed on the exposed portions 3f1 of the base electrode layers 3f with high dimensional accuracy as a result.

(Method of Manufacturing Wiring Board 1b)

Next, a method of manufacturing the wiring board 1b according to this embodiment will be described with reference to FIGS. 4 and 11. FIGS. 11A-11E are diagrams illustrating the method of manufacturing the wiring board 1b, where FIGS. 11A-11E illustrating individual steps thereof.

First, a plurality of ceramic green sheets are prepared, each ceramic green sheet being formed by spreading or printing a slurry constituted of a ceramic raw material, a resin material, and an organic solvent on a resin film and then drying the spread or printed slurry. Here, various types of wiring electrodes are printed onto the surface of each ceramic green sheet using a conductive paste containing a metal such as Cu, and via conductors are formed by forming through-holes (via holes) in predetermined locations.

Then, the ceramic green sheets in which the various types of wiring electrodes, via conductors, and so on have been formed are separated from the resin films, and the separated ceramic green sheets are layered in a predetermined order; the insulating layer 2a formed by layering the plurality of ceramic green sheets is prepared in this manner (a preparation step).

Figure 11A:
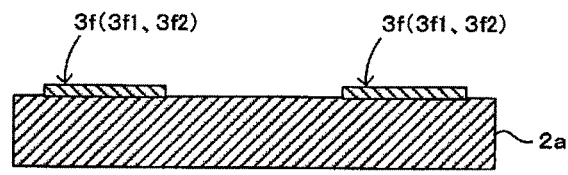
FIGS. 11A-11E are diagrams illustrating a method of manufacturing the wiring board illustrated in FIG. 10.
Figure 11B:
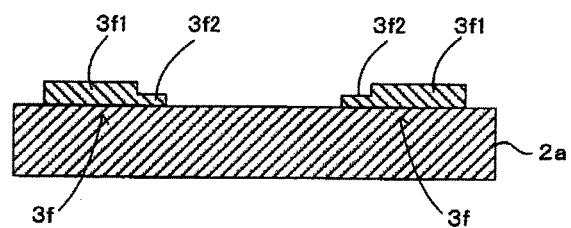

Next, as illustrated in FIGS. 11A and 11B, the base electrode layers 3f are formed in predetermined regions of the one primary surface of the insulating layer 2a through two instances of screen printing using a conductive paste containing Cu and the mask members 7a and 7b, through the same procedure as in the method of manufacturing the wiring board 1 according to the first embodiment (a base electrode layer forming step). At this time, in the base electrode layers 3f, the covered portions 3f2 are formed so as to be thinner than the exposed portions 3f1, and steps are formed at the borders between the exposed portions 3f1 and the covered portions 3f2, in the same manner as in the wiring board 1 according to the first embodiment.

Figure 11C:
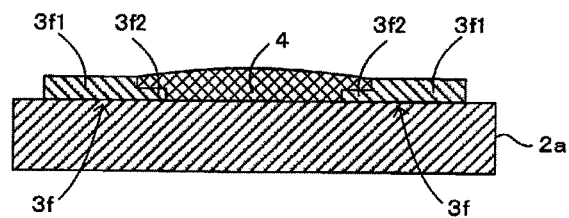

Next, as illustrated in FIG. 11C, the insulating covering layer 4 is layered on the one primary surface of the insulating layer 2a in a state covering parts of the edge portions of the base electrode layers 3f (the covered portions 3f2), using the same procedure as in the method of manufacturing the wiring board 1 according to the first embodiment (an insulating covering layer forming step). Here, the steps are formed at the borders between the exposed portions 3f1 and the covered portions 3f2 as a result of the covered portions 3f2 of the base electrode layers 3f being formed thinner than the exposed portions 3f1. As a result, the insulating paste that forms the insulating covering layer 4 is suppressed from spreading by the steps and accumulates on the covered portions 3f2 of the base electrode layers 3f. Accordingly, the insulating covering layer 4 that covers the covered portions 3f2 of the base electrode layers 3f can be formed thicker than in conventional wiring boards in which the base electrode layers 3f are provided at a uniform thickness. Note that in the preparation step, when preparing the ceramic green sheets, the base electrode layers 3f and the insulating covering layer 4 may be formed in advanced through the above-described screen printing on the ceramic green sheet that will serve as the uppermost layer of the insulating layer 2a.

Figure 11D:
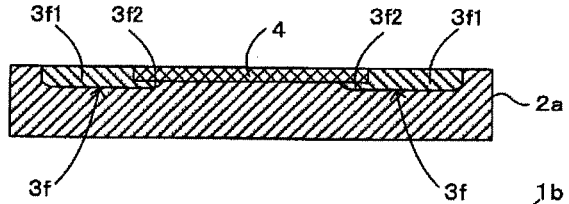

Next, as illustrated in FIG. 11D, the ceramic green sheet multilayer body on the surface of which the base electrode layers 3f and the insulating covering layer 4 have been layered (that is, the insulating layer 2a) is pressed while being heated at a predetermined temperature, thus pressure-bonding the ceramic green sheets of the insulating layer 2a (a pressing step). At this time, the base electrode layers 3f and the insulating covering layer 4 are pressed into the insulating layer 2a through the pressing, and the surfaces of the exposed portions 3f1 of the base electrode layers 3f, the surface of the insulating covering layer 4, and the one primary surface of the insulating layer 2a are disposed in substantially the same plane.

Here, because the covered portions 3f2 of the base electrode layers 3f are formed so as to be thinner than the exposed portions 3f1, the insulating covering layer 4 can be formed thicker on the covered portions 3f2 than in conventional wiring boards in which the base electrode layers have a uniform thickness. In addition, the pressure acting on the insulating covering layer 4 on the covered portions 3f2 during the pressing is reduced by the difference between the thicknesses of the exposed portions 3f1 and the covered portions 3f2 of the base electrode layers 3f, and thus the insulating covering layer 4 on the covered portions 3f2 of the base electrode layers 3f is prevented from becoming thinner even in the case where the multilayer body is pressed.

Next, the pressed multilayer body is fired at a predetermined temperature (850° C., for example).

Figure 11E:
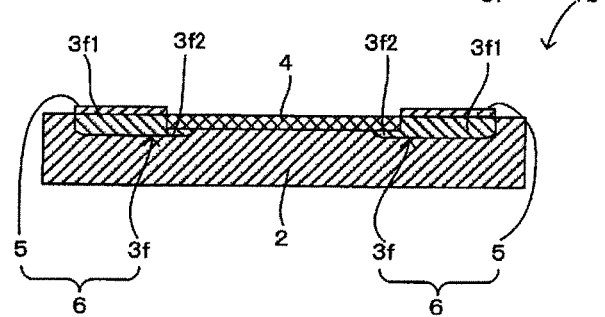

Next, as illustrated in FIG. 11E, the surface electrode layers 5 constituted by Ni/Au plating is formed on the exposed portions of the base electrode layers 3f and the wiring board 1b is completed through the same procedure as in the method of manufacturing the wiring board 1 according to the first embodiment (a surface electrode layer forming step). At this time, the parts of the insulating covering layer 4 that cover the covered portions 3f2 of the base electrode layers 3f are formed so as to be thicker than in the past, and the surface electrode layers 5 are therefore prevented from being formed on the insulating covering layer 4 that covers the covered portions 3f2. As a result, the surface electrode layers 5 are formed on the exposed portions 3f1 of the base electrode layers 3f with high dimensional accuracy, in the same manner as in the wiring board 1 according to the first embodiment.

Thus according to the above-described embodiment, forming the covered portions 3f2 of the base electrode layers 3f so as to be thinner than the exposed portions 3f1 makes it possible to prevent the insulating covering layer 4 on the covered portions 3f2 of the base electrode layers 3f from becoming thinner when the multilayer body constituted of the insulating layer 2a, the base electrode layers 3f, and the insulating covering layer 4 is pressed. Accordingly, the same effects as those of the wiring board 1 according to the first embodiment can be achieved even in the case where the manufacture of the wiring board 1b includes a pressing process. Note that the same effects as in the second embodiment can be achieved in the case where the method of manufacturing the wiring board 1a according to the second embodiment is provided with the above-described pressing process.

(Variation on Insulating Covering Layer)

Figure 12:
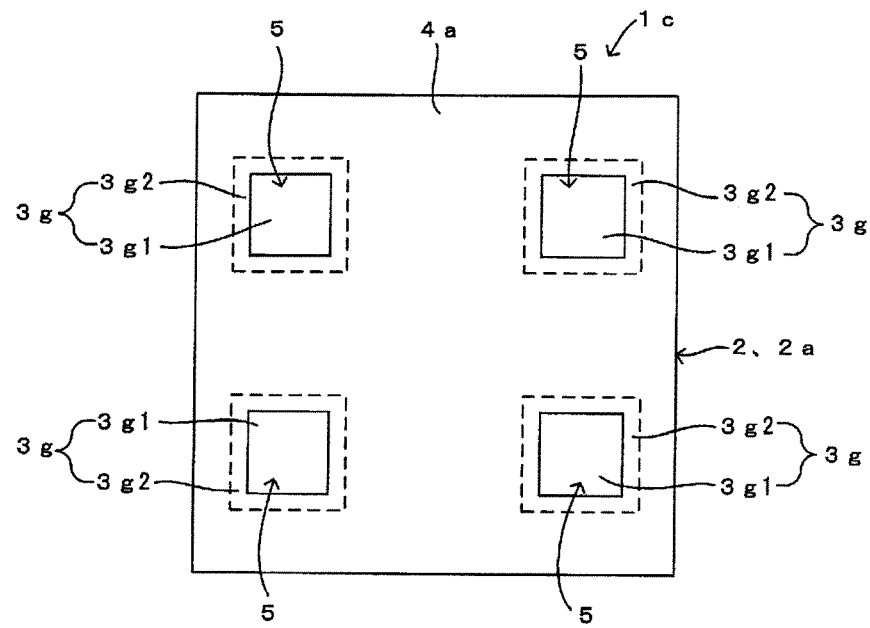
FIG. 12 is a diagram illustrating a variation on an insulating covering layer.
Figure 13:
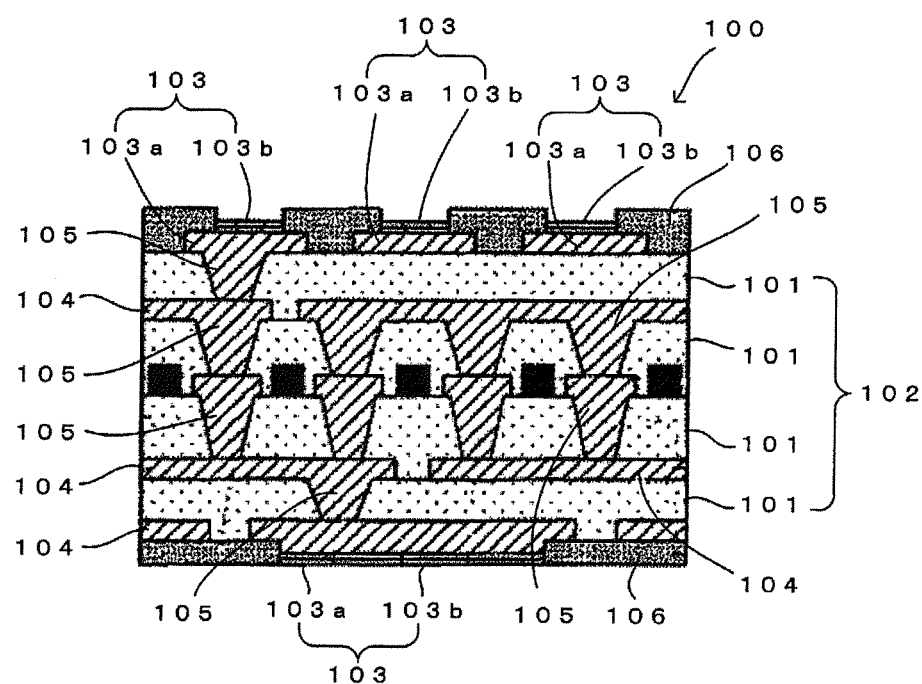
FIG. 13 is a diagram illustrating an example of a conventional wiring board.

Next, a variation on the insulating covering layer 4 will be described with reference to FIG. 12. FIG. 12 is a diagram illustrating this variation, and is a plan view of a wiring board 1c.

The above-described embodiments describe cases where the insulating covering layer 4 is layered upon the one primary surface of the insulating layer 2 or 2a in a state where the insulating covering layer 4 covers parts of the edge portions of the base electrode layers 3a to 3f; however, for example, an insulating covering layer 4a may be layered upon the one primary surface of the insulating layer 2 or 2a in a state where the insulating covering layer 4a covers all of the edge portions (peripheral edges) of base electrode layers 3g, as illustrated in FIG. 12. In this case, the entire region of the edge portions of each base electrode layer 3g (a covered portion 3g2) may be formed so as to be thinner than an exposed portion 3g1. By doing so, in each base electrode layer 3g, the exposed portion 3g1 of the base electrode layer 3g is formed as a slightly smaller quadrangle than the outer quadrangular shape of the base electrode layer 3g when viewed in plan view, and thus the surface electrode layer 5 can be formed on the exposed portion 3g1 with high dimensional accuracy.

The present disclosure is not intended to be limited to the above-described embodiments, and many changes can be made thereto without necessarily departing from the essential spirit of the present disclosure. For example, although the above-described embodiments describe a case where the outer electrodes 6 are used as electrodes for connecting to an external motherboard, the outer electrodes 6 may be used as, for example, land electrodes for mounting components on the one primary surface of the insulating layer 2 or 2a. In this case, the outer electrodes 6 have high dimensional accuracy, and thus can be applied in mounting components whose terminals are disposed at a narrow pitch.

Furthermore, although the above-described embodiments describe an example of a structure in which a single insulating covering layer 4 or 4a is formed spanning over the adjacent base electrode layers 3a to 3g of the plurality of outer electrodes 6 and covers the covered portions 3a2 to 3g2 of the plurality of base electrode layers 3a to 3g, the structure may be such that a plurality of the insulating covering layers 4 or 4a cover the covered portions 3a2 to 3g2 of the base electrode layers 3a to 3g individually.

INDUSTRIAL APPLICABILITY

The present disclosure can be applied to various types of wiring boards that include outer electrodes constituted by base electrode layers and surface electrode layers.

REFERENCE SIGNS LIST 1, 1a-1c WIRING BOARD
2, 2a INSULATING LAYER
3a-3g BASE ELECTRODE LAYER
3a1-3g1 EXPOSED PORTION
3a2-3g2 COVERED PORTION
4, 4a INSULATING COVERING LAYER
5 SURFACE ELECTRODE LAYER
7a-7c MASK MEMBER

The invention claimed is:

1. A wiring board comprising:
an insulating layer;
a base electrode layer layered upon a predetermined region of one primary surface of the insulating layer;
an insulating covering layer layered upon the one primary surface of the insulating layer in a state covering at least part of an edge portion of the base electrode layer; and
a surface electrode layer plated on an exposed portion of the base electrode layer that is not covered by the insulating covering layer,
wherein the covered portion of the base electrode layer covered by the insulating covering layer is formed so as to be thinner than the exposed portion,
wherein the covered portion of the base electrode layer has a pattern that is T-shaped when viewed in plan view; and
a leg portion of the T-shaped pattern is connected to an edge portion of the exposed portion.

2. The wiring board according to claim 1,
further comprising a plurality of the base electrode layers adjacent to each other,
wherein the insulating covering layer is formed so as to span a gap between the adjacent base electrode layers.

3. The wiring board according to claim 1,
wherein the insulating covering layer on the covered portion is no less than 1 µm thick.

4. The wiring board according to claim 1,
wherein the insulating covering layer on the covered portion is no less than 5 µm thick.

5. The wiring board according to claim 1, wherein a width of the T-shaped covered portion of the base electrode layer is less than ½ of a minimum width of the exposed portion.

* * * * *